(12) United States Patent
Huber et al.

(10) Patent No.: US 7,126,414 B2
(45) Date of Patent: Oct. 24, 2006

(54) ARRANGEMENT AND METHOD FOR CONTROLLING AN AMPLIFIER CIRCUIT CORRESPONDING TO ENERGY UPTAKE IN THE AMPLIFIER CIRCUIT

(75) Inventors: Herbert Huber, Vienna (AT); Tibor Olah, Vienna (AT)

(73) Assignee: Infineon Technologies AG, Munich (DE)

( * ) Notice: Subject to any disclaimer, the term of this patent is extended or adjusted under 35 U.S.C. 154(b) by 56 days.

(21) Appl. No.: 10/934,899

(22) Filed: Sep. 3, 2004

(65) Prior Publication Data
US 2005/0083119 A1 Apr. 21, 2005

(51) Int. Cl.
*H03F 1/02* (2006.01)
*H03F 3/68* (2006.01)
*H03F 3/00* (2006.01)

(52) U.S. Cl. .............................. 330/9; 330/84; 330/148

(58) Field of Classification Search ........ 327/560–563; 330/9, 84, 148
See application file for complete search history.

(56) References Cited

U.S. PATENT DOCUMENTS

| | | | |
|---|---|---|---|
| 3,043,997 A | 7/1962 | Marshall | 318/681 |
| 6,853,241 B1 * | 2/2005 | Fujimoto | 330/9 |

* cited by examiner

*Primary Examiner*—Robert Pascal
*Assistant Examiner*—Alan Wong
(74) *Attorney, Agent, or Firm*—Maginot Moore & Beck

(57) ABSTRACT

An amplifier circuit (1) is disclosed, wherein with a view to reducing the leakage power of the amplifier circuit (1) a current path (6) is provided between a first output terminal (A1) and a second output terminal (A2) of the amplifier circuit, said current path being open in the case of an uptake of energy at the output of the amplifier circuit (1), so that the electrical energy taken up by the one output terminal (A1) can be drained away immediately via the other output terminal (A2). If no uptake of energy is taking place via the output of the amplifier circuit (1) but instead electrical energy is being released by the amplifier circuit (1), the current path (6) between the two output terminals (A1, A2) is closed.

19 Claims, 3 Drawing Sheets

ARRANGEMENT AND METHOD FOR CONTROLLING AN AMPLIFIER CIRCUIT CORRESPONDING TO ENERGY UPTAKE IN THE AMPLIFIER CIRCUIT

BACKGROUND

The present invention relates to an amplifier circuit, in particular an amplifier circuit with low leakage power.

Amplifiers that not only release energy but also, at least at times, take up energy at their output give rise to an unnecessarily high leakage power. It is not exclusively the supplied energy that is dissipated, but also additional energy which is withdrawn unnecessarily from the voltage supply. Therefore more elaborate, more expensive measures are required for the dissipation of heat. Furthermore, supply energy is wasted, which is disadvantageous particularly in the case of battery-driven devices.

An example of the uptake of energy by an amplifier via the output thereof is the connection of a reactive, for example capacitive, load to the output of the amplifier. A capacitive load of such a type is, for example, the European ringer load of a terminal device on an analogue subscriber line. Amplifiers that drive a capacitive load have a high leakage power. In the course of the charging process, at least the same amount of energy is dissipated in the amplifier as is transferred into the capacitive load. In the course of the discharging process, in addition to the amount of energy stored in the capacitive load at least twice as much energy is again dissipated in the amplifier. In the most favourable case, i.e. in the course of charging the capacitive load or the corresponding capacitance to the value of the full supply voltage, for each charge-discharge cycle the fourfold value of the energy stored maximally in the capacitive load is dissipated.

A further example of the uptake of energy by an amplifier via the output thereof is the connection of a reactive inductive load, for example an electromechanical or electroacoustic converter, to the amplifier. Also in the case of full-duplex transmission lines such as are employed, for example, in XDSL transmission systems ("Digital Subscriber Line") for bidirectional transmission of speech and data, at the amplifiers that are connected at both ends of the transmission line with impedance synthesis the uptake of energy occurs via the outputs of said amplifiers.

FIG. 5 shows schematically an amplifier 1 which is connected to a load 3, in particular a reactive load, via its output terminals A1, A2. In the example that is represented, the amplifier 1 comprises two sub-amplifiers 4, 5, the output of sub-amplifier 4 being coupled to output terminal A1 and the output of sub-amplifier 5 being coupled to output terminal A2. The two sub-amplifiers are connected to supply-voltage nodes or supply-voltage terminals V+, V− of the amplifier 1, to which in turn a supply voltage 2 is connected. In the case of an uptake of energy by the amplifier 1 via the output thereof by reason of the reactive load connected thereto, a flow of current occurs from the one output terminal to the other output terminal, this flow of current being routed, in particular, at least partially via the supply-voltage path. Thus, for example, in the case of the uptake of energy via the output of the amplifier 1 a flow of current starting from the output terminal A1 may be directed to the other output terminal A2 of the amplifier 1 via the sub-amplifier 4 and the supply-voltage terminal V−, the supply-voltage source 2, the supply-voltage terminal V+ and the sub-amplifier 5. This flow of current via the supply-voltage path results in the problems previously described, namely, in particular, the fact that in the case of an uptake of energy via the output of the amplifier 1 additional energy, which is withdrawn unnecessarily from the supply-voltage source 2, is dissipated in the amplifier.

In conventional solutions an overheating of the components by the additionally dissipated energy is avoided by appropriate dimensioning of the dissipation of heat from the amplifier 1, for example by providing an appropriately large cooling attachment on the amplifier 1. However, the effort required for these measures is relatively great, and the costs thereof are relatively high.

The object underlying the present invention is therefore to make available an amplifier circuit in which the leakage power of the amplifier circuit can be reduced with low costs and with little effort.

SUMMARY

The present invention proposes connecting circuit means between a first output terminal and a second output terminal of the amplifier circuit, said circuit means being configured in such a way that in the case where the amplifier circuit is substantially taking up no electrical energy via the first and second output terminals the circuit means electrically disconnect the first output terminal from the second output terminal, whereas in the case of uptake of electrical energy via the first and second output terminals the two output terminals are electrically connected to one another in such a way that electrical energy taken up can be drained away from the one output terminal directly via the other output terminal. By virtue of this technical measure, the electrical energy taken up via the output of the amplifier circuit is converted into heat without additional energy having to be taken up from the source of supply voltage. This is obtained by virtue of the direct current path between the two output terminals of the amplifier circuit, which, in particular, is not routed via the supply-voltage path of the amplifier circuit.

The circuit means previously described, which in the case of an uptake of energy via the output of the amplifier circuit open the current path between the two output terminals of the amplifier circuit, may be configured in the form of a separate circuit part or alternatively also as an integral part of a sub-amplifier of the amplifier circuit. In this case the circuit means together with the amplifier circuit may constitute a structural unit, it being possible in principle, however, for the circuit means to constitute a self-contained addition to the amplifier circuit.

The sub-amplifiers of the amplifier circuit are each connected between an input terminal and one of the output terminals of the amplifier circuit, it being possible for the sub-amplifiers to be directly connected to the output terminals. However, depending upon the technical realisation of the circuit means previously described or of the current path realised thereby between the two output terminals, the insertion of a functional block between the output of each sub-amplifier and the corresponding output terminal and the current path may also be required.

The circuit means, which open the current path between the two output terminals of the amplifier circuit in the case of an uptake of energy via the output of the amplifier circuit, are preferably configured in such a way that they open the current path in case a potential at the one output terminal of the amplifier circuit is higher than a potential at the other output terminal of the amplifier circuit, whereas they close the current path and therefore electrically disconnect the two output terminals from one another in case the potential at the other output terminal is higher than the potential at the first-named output terminal. With a view to realising this function, a series circuit consisting of a diode and a transistor may be connected between the two output terminals, the circuit means connected between the output terminals preferably being constructed symmetrically, so that in analogous manner a series circuit consisting of a diode and a transistor is also connected between the other output terminal and the first-named output terminal of the amplifier circuit. The transistors may preferably be bipolar transistors, an additional diode being connected between the emitter and base terminals of the bipolar transistors.

The present invention is suitable generally for use in amplifier circuits in which the leakage power is to be as low as possible. In particular, the present invention can be employed in telecommunications applications in amplifier circuits of the type previously described.

BRIEF DESCRIPTION OF THE DRAWINGS

The present invention will be elucidated below in greater detail with reference to the drawing on the basis of preferred exemplary embodiments.

DESCRIPTION

Figure 1:
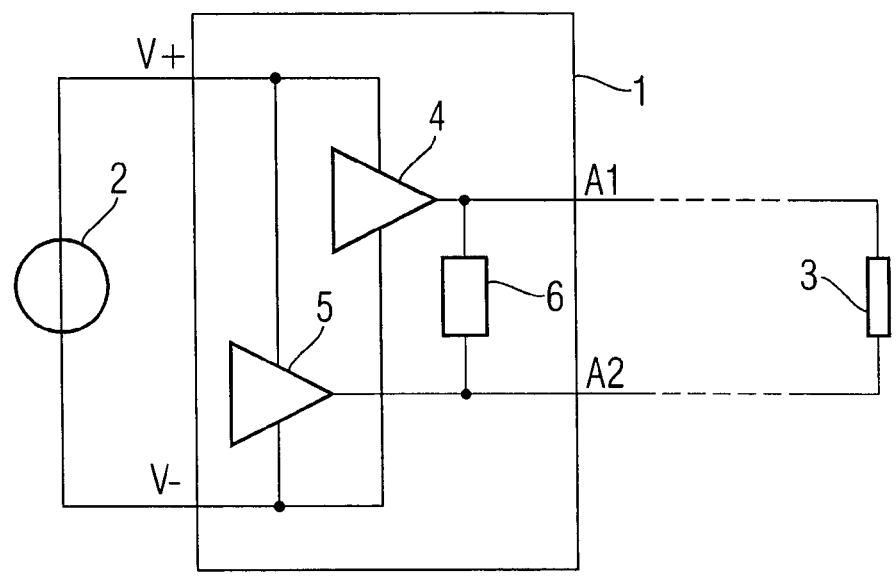
FIG. 1 shows a schematic block diagram of an amplifier circuit according to the invention.
Figure 5:
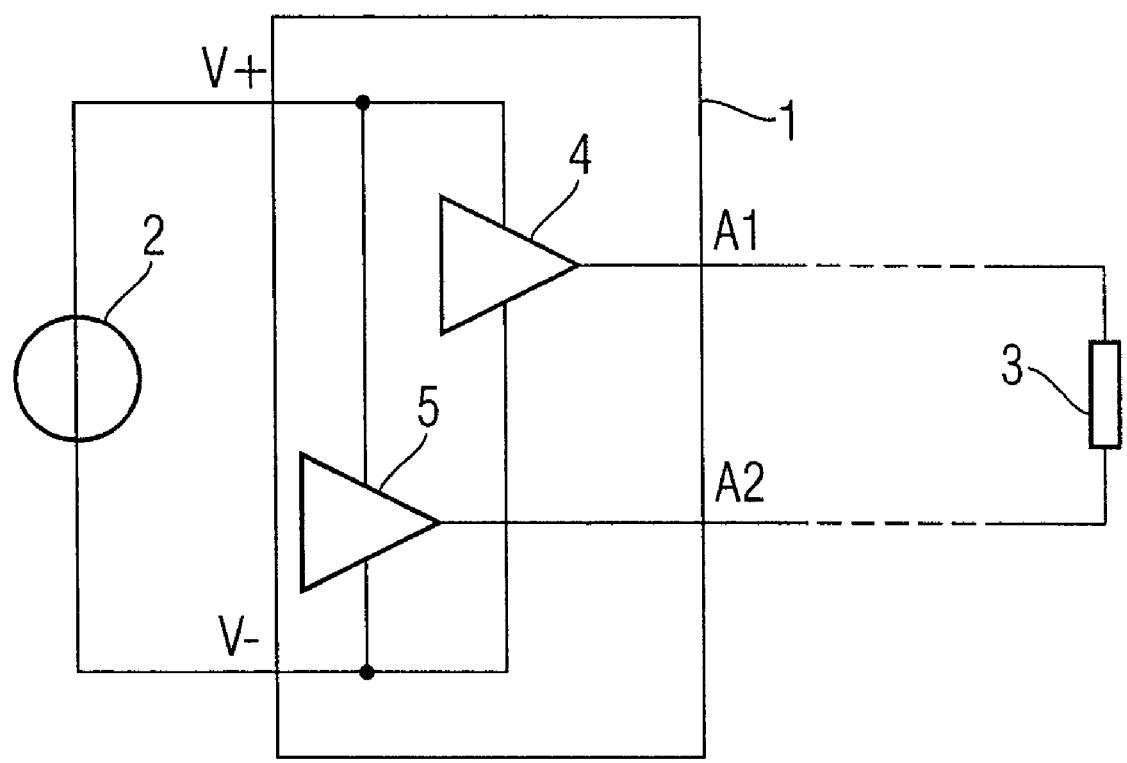
FIG. 5 shows a schematic block diagram of an amplifier circuit according to the state of the art.

The amplifier circuit shown in FIG. 1 comprises an amplifier 1 with two sub-amplifiers 4, 5 which are connected up to a voltage source 2 in a manner analogous to the amplifier circuit represented in FIG. 5, so that the voltage source 2 is connected to supply-voltage terminals V+, V− or to corresponding supply-voltage nodes of the amplifier 1. Moreover, the amplifier 1 comprises output terminals A1, A2 or corresponding output nodes, to which a load 3, for example a reactive inductive or capacitive load, is connected. By virtue of this reactive load 3, the uptake of electrical energy can occur via the output terminals A1, A2.

In order to lessen the leakage power of the amplifier 1 in the case of an uptake of energy via the output terminals A1, A2, according to FIG. 1 a circuit 6 is provided between the output terminals A1, A2, said circuit being configured in such a way that electrical energy taken up via the output of the amplifier 1 is converted into heat without additional energy having to be taken up from the supply-voltage source 2. This is obtained, in particular, by virtue of the fact that by means of the circuit 6 a current path between the output terminals A1 and A2 is created which is not routed via the supply-voltage path of the amplifier 1 and which guarantees that in the case of a momentary uptake of energy by the amplifier 1 via the output terminals A1, A2 this direct current path can be utilised in order to drain the energy away from one of the output terminals A1, A2 immediately via the other output terminal, so that no electrical energy is withdrawn from the supply-voltage source 2. In the operating state of an uptake of energy via the output of the amplifier 1, which is constituted by the output terminals A1 and A2, the output terminals A1 and A2 are consequently electrically connected to one another via the current path realised by the circuit 6. In an operating state of the amplifier 1 in which no uptake of energy takes place via the output of the amplifier 1, on the other hand the circuit 6 guarantees an electrical separation between the output terminals A1 and A2.

Figure 2:
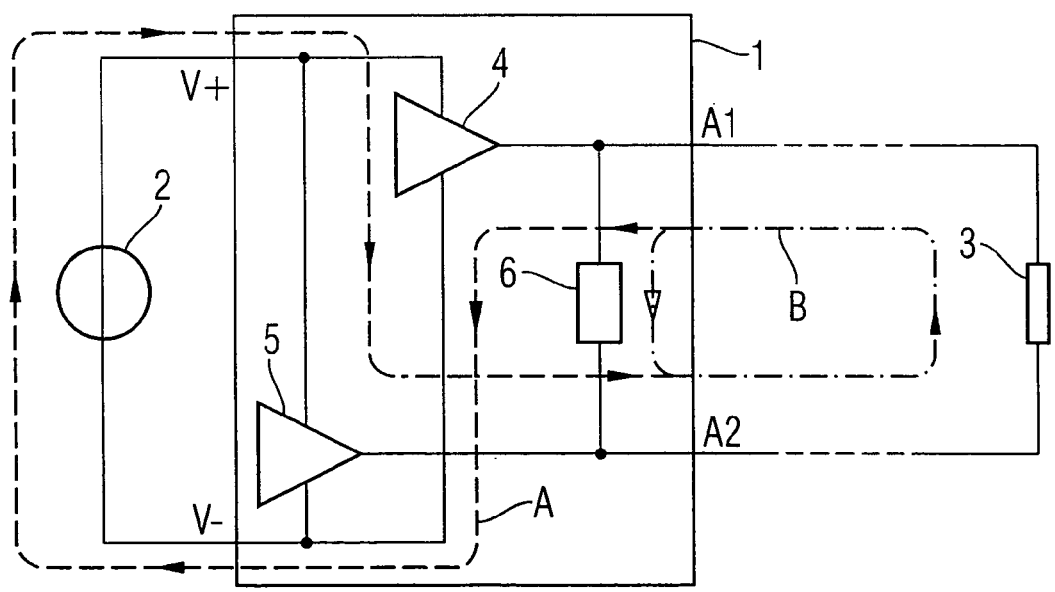
FIG. 2 shows a representation of the amplifier circuit of the invention shown in FIG. 1 with a representation of current paths.

The operating principle of the amplifier circuit shown in FIG. 1 is represented in greater detail in FIG. 2. In FIG. 2 a current path A is represented for the case of an uptake of energy via the output of the amplifier 1 if, in a manner similar to FIG. 5, the circuit 6 with the direct current path between the output terminals A1, A2 is dispensed with. From FIG. 2 it is evident that in this case, as already described, by reason of the uptake of energy via the output of the amplifier 1 a flow of current runs from the output terminal A1 to the output terminal A2 via the sub-amplifier 4, the supply-voltage path of the amplifier 1 and the sub-amplifier 5. On the other hand, if the circuit 6 with the direct current path between the output terminals A1 and A2 is provided, in conformity with FIG. 1, then in the case of an uptake of energy by the amplifier 1 via the output thereof a flow of current B takes place from the output terminal A1 immediately to the output terminal A2 via the current path realised by the circuit 6, without being routed via the supply-voltage path of the amplifier 1.

As has already been elucidated previously, the circuit 6 is configured in such a way that it opens the current path between the output terminals A1, A2 if the amplifier 1 is taking up electrical energy via its output. One possible circuit-engineering realisation of the circuit 6 for the purpose of guaranteeing this functionality is represented in FIG. 3.

Figure 3:
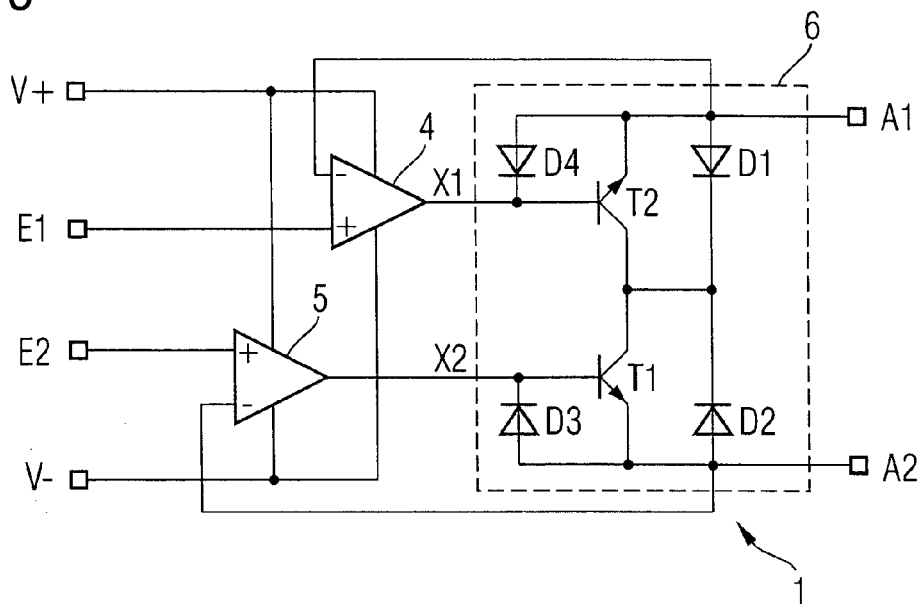
FIG. 3 shows a possible realisation of the amplifier circuit shown in FIG. 1 and FIG. 2 according to a preferred exemplary embodiment of the present invention.

FIG. 3 shows one possible internal structure of the amplifier 1 with the supply-voltage terminals V+, V− and with the output terminals A1, A2. In addition, in FIG. 3 the sub-amplifiers 4, 5 are represented, the non-inverting input of each sub-amplifier 4, 5 being connected to an input terminal E1, E2 of the amplifier 1. The inverting inputs of the sub-amplifiers 4, 5 are each connected to one of the output terminals A1, A2, in which respect the representation of FIG. 3 is to be understood to be merely exemplary. Additional components or functional blocks may be provided both between the input terminals E1, E2 and the sub-amplifiers 4, 5 and between the sub-amplifiers 4, 5 and the output terminals A1, A2. The sole consideration of importance is that the sub-amplifiers 4, 5 are connected between the input terminals E1, E2 and the output terminals A1, A2, so that at the output terminals A1, A2 an amplified version of an input signal that is applied to the input terminals E1, E2 can be picked up in the form of an output signal.

The current path between the two output terminals A1 and A2 that is realised by the circuit 6 must be open when the amplifier 1 is taking up electrical energy via its output, whereas in the other case the current path realised by the circuit 6 should be closed. For this purpose the circuit 6 comprises, according to the exemplary embodiment shown in FIG. 3, a series circuit consisting of a diode D1 and a bipolar transistor T1, the diode D1 being connected in series to the collector-emitter section of the bipolar transistor T1 between the output terminals A1 and A2. The base of the bipolar transistor T1 is connected to the output of the sub-amplifier 5. If the voltage potential applied at the output terminal A1 is somewhat higher than the voltage potential applied at the output terminal A2, this state corresponding to an uptake of energy via the output of the amplifier 1, then the bipolar transistor T1 is not in a state of saturation, and a current that was drawn directly from the output terminal A1 via the diode D1 is able to drain off via the output terminal A2. On the other hand, if the voltage potential at the output terminal A1 is lower than that at the output terminal A2, i.e. if a release of energy is taking place via the output of the amplifier 1, then the diode D1 is blocked, and the bipolar transistor T1 is in a state of saturation. In this state the output current at the output terminal A2 is drawn only via the base of the bipolar transistor T1 from a nodal point X2 between the output of the sub-amplifier 5 and the base of the bipolar transistor T1. In this case the sub-amplifier 5 supplies the output current for the output terminal A2 from the supply-voltage terminal or supply-voltage node V+. Between the base and the emitter of the bipolar transistor T1 a further diode D3 is connected for the purpose of assisting this mode of operation and for the purpose of protection, the diode D3 only being conducting if the voltage potential at the output terminal A2 is higher than at the base of the bipolar transistor T1.

As is evident from FIG. 3, the circuit 6 is constructed symmetrically with respect to the two output terminals A1, A2, so that between the output terminal A2 and the output terminal A1 a further diode D2 is connected in series with the collector-emitter section of a further bipolar transistor T2. The base of the bipolar transistor T2 is connected at a circuit node X1 to the output of the sub-amplifier 4, and a further diode D4 is connected between the emitter and the base of the bipolar transistor T2. The junction points between the diode D1 and the bipolar transistor T1, on the one hand, and between the diode D2 and the bipolar transistor T2, on the other hand, are connected to one another at a circuit node Z.

By reason of the symmetry, what has been stated with respect to the output current flowing via the output terminal A2 also applies, mutatis mutandis, in respect of the output current flowing via the output terminal A1.

The advantage of the realisation of the circuit 6 represented in FIG. 3 lies in the automatic opening of the current path between the two output terminals A1 and A2 in the case of an uptake of energy via the output of the amplifier 1, so that no separate control is necessary for this purpose. However, deviations from the exemplary embodiment represented in FIG. 3 are of course also conceivable. In particular, the circuit 6 may also be integrated, at least partially, within at least one of the sub-amplifiers 4, 5. Similarly, the circuit 6 may also be constructed outside the amplifier 1 in the form of a self-contained addition. Depending upon the technical realisation of the current path of the circuit 6, the insertion of one or more functional blocks or components between the sub-amplifiers 4, 5 and the output terminals A1, A2 as well as the current path realised by the circuit 6 may also be required. The diodes D1–D4 and the bipolar transistors T1, T2 may also be replaced by other suitable circuit elements which guarantee the previously described function of the circuit 6 in analogous manner.

Figure 4A:
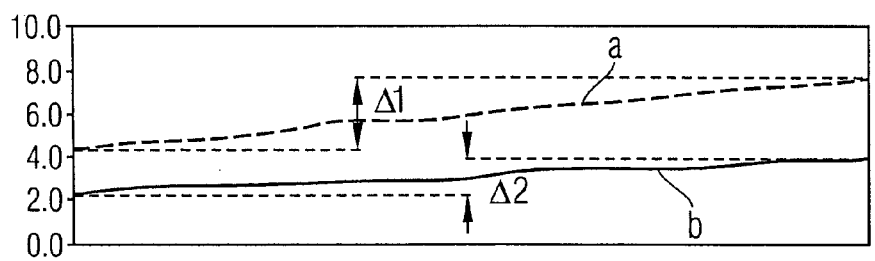
FIGS. 4A–4C show signal curves for the purpose of clarifying the operating principle of the amplifier circuit according to the invention in comparison with a conventional amplifier circuit.
Figure 4B:
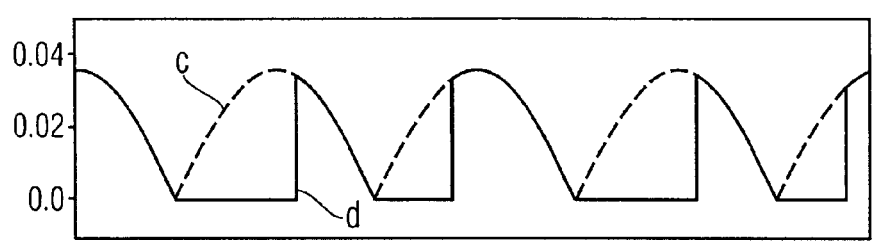
Figure 4C:
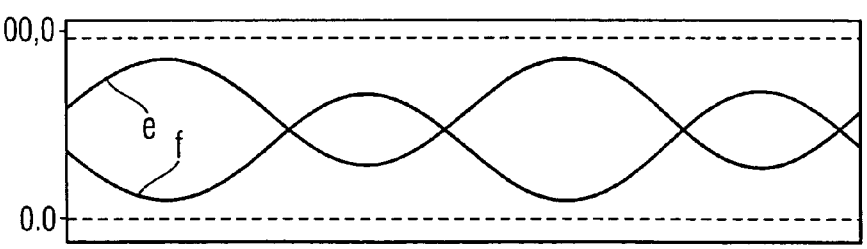

In FIGS. 4A–4C various signal curves for the amplifier circuit shown in FIG. 3 are represented on the assumption of a capacitive load. In this connection, in FIG. 4A the energy in [As] taken up by the amplifier 1 over time is plotted, on the one hand for a known amplifier circuit in the form of a characteristic a, and on the other hand for the amplifier circuit according to the invention in the form of a characteristic b. From FIG. 4A it is evident that the uptake of energy Δ2 in the case of the amplifier circuit according to the invention was able to be almost halved in comparison with the uptake of energy Δ1 of the known amplifier circuit. In FIG. 4B the output current drawn via the supply-voltage path of the known amplifier circuit is represented in the form of a characteristic c, whereas a characteristic d represents the output current in [A] over time that is drawn off from the supply-voltage path in the case of the amplifier circuit according to the invention. From FIG. 4B it is also evident that in the case of the amplifier circuit according to the invention merely a fraction of the output current is drawn from the supply voltage in comparison with the known amplifier circuit. Finally, in FIG. 4C the time-dependent progression of the voltage potentials at the output terminal A1 (see characteristic e) and at the output terminal A2 (see characteristic f) matching the current curve of FIG. 4B and the curve of the uptake of energy of FIG. 4A is represented for the amplifier circuit according to the invention shown in FIG. 3. In addition, for comparison purposes the supply-voltage potential is also indicated in FIG. 4C by dashed lines.

The invention claimed is:

1. An amplifier comprising:
   at least one input terminal for receiving an input signal to be amplified;
   a first output terminal and a second output terminal, the first output terminal and second output terminal operable to output an output signal corresponding to the amplified input signal; and
   a circuit connected between the first output terminal and the second output terminal, the circuit operable to electrically disconnect the first output terminal from the second output terminal when the amplifier is in a first operating state wherein the amplifier substantially takes up no electrical energy via the first output terminal and the second output terminal, the circuit further operable to electrically connect the first output terminal to the second output terminal when the amplifier is in a second operating state wherein the amplifier is taking up electrical energy via the first output terminal and the second output terminal, the circuit thereby draining the electrical energy taken up away from the first output terminal via the second output terminal when the amplifier is in the second operating state.

2. The amplifier according to claim 1, wherein the amplifier includes supply-voltage terminals for connecting the amplifier to a supply-voltage source via a supply-voltage path, the circuit being configured in such a way that in the second operating state the circuit does not drain the electrical energy taken up away from the first output terminal to the second output terminal via the supply-voltage path.

3. The amplifier according to claim 1, wherein the circuit together with the amplifier constitute a structural unit.

4. The amplifier according to claim 1, wherein at least one input terminal includes a first input terminal and a second input terminal for receiving the input signal, and wherein the amplifier further comprises a first sub-amplifier connected between the first input terminal and the first output terminal, and a second sub-amplifier connected between the second input terminal and the second output terminal.

5. The amplifier according to claim 4, wherein the circuit is at least partially an integral part of at least one of the first sub-amplifier or second sub-amplifier.

6. The amplifier according to claim 1, wherein the circuit is configured in such a way the circuit electrically disconnects the first output terminal and the second output terminal from one another when a voltage potential at the second output terminal is higher than a voltage potential at the first output terminal, and wherein the circuit is further configured in such a way that the circuit electrically connects the first output terminal to the second output terminal when the voltage potential at the first output terminal is higher than the voltage potential at the second output terminal.

7. The amplifier according to claim 1, wherein the circuit is configured in such a way that a current from the first output terminal is conducted to the second output terminal via the circuit when a voltage potential at the first output terminal is higher than a voltage potential at the second output terminal, and wherein the circuit is further configured in such a way that the circuit drains a current to be output via the second output terminal away out of a supply-voltage path of the amplifier in case the voltage potential at the second output terminal is higher than the voltage potential at the first output terminal.

8. The amplifier according to claim 1, wherein the circuit is constructed symmetrically in relation to the first output terminal and the second output terminal.

9. The amplifier according to claim 1, wherein the circuit comprises a diode and a transistor arranged in such a way that in the first operating state of the amplifier the diode blocks current and an electrical current is supplied to the second output terminal via the transistor, and in the second operating state of the amplifier the diode is conducts current and an electrical current from the first output terminal is supplied to the second output terminal via the diode and the transistor.

10. The amplifier according to claim 9, wherein the transistor is connected with a first terminal and a second terminal between the diode and the second output terminal, such that in the first operating state of the amplifier the electrical current is supplied to the second output terminal via the transistor starting from a control terminal of the transistor, and in the second operating state of the amplifier the electrical current from the first output terminal is supplied to the second output terminal via the diode and the first and second terminals of the transistor.

11. The amplifier according to claim 10, wherein a further diode is connected between the second terminal and the control terminal of the transistor such that the further diode blocks current if a voltage potential at the control terminal of the transistor is higher than a voltage potential at the second output terminal, and the further diode conducts current if the voltage potential at the second output terminal is higher than the voltage potential at the control terminal of the transistor.

12. The amplifier according to claim 9, wherein the transistor is a bipolar transistor.

13. An amplifier comprising:
    at least one input terminal for receiving an input signal to be amplified;
    a first output terminal and a second output terminal, the first output terminal and second output terminal operable to output an output signal corresponding to the amplified input signal; and
    means for (i) electrically disconnecting the first output terminal from the second output terminal when the amplifier is in a first operating state wherein the amplifier substantially takes up no electrical energy via the first output terminal, and (ii) electrically connecting the first output terminal to the second output terminal when the amplifier is in a second operating state wherein the amplifier is taking up electrical energy via the first output terminal.

14. The amplifier of claim 13, wherein electrical energy taken up away from the first output terminal is drained via the second output terminal when the amplifier is in the second operating state.

15. The amplifier of claim 13, wherein at least one input terminal includes a first input terminal and a second input terminal for receiving the input signal, and wherein the amplifier further comprises a first sub-amplifier connected between the first input terminal and the first output terminal, and a second sub-amplifier connected between the second input terminal and the second output terminal.

16. A method of reducing the leakage power of an amplifier having an output including a first and a second output terminal, the method comprising:
    electrically disconnecting the first output terminal from the second output terminal in dependence upon whether electrical energy is being released by the output of the amplifier; and
    electrically connecting the first output terminal to the second output terminal when electrical energy is being taken up by the output, and thereby draining the electrical energy taken up away from the first output terminal via the second output terminal.

17. The amplifier of claim 1, wherein:
    the circuit connected between the first output terminal and the second output terminal is further operable to electrically disconnect the first output terminal from the second output terminal based on whether the amplifier is in the first operating state.

18. The amplifier of claim 1, wherein:
    the circuit connected between the first output terminal and the second output terminal is further operable to electrically connect the first output terminal from the second output terminal based on whether the amplifier is in the second operating state.

19. The amplifier of claim 1, wherein:
    the second operating state comprises a state in which the amplifier takes up electrical energy via the first output terminal as a result of a reactive load coupled between the first output terminal and the second output terminal.

* * * * *

UNITED STATES PATENT AND TRADEMARK OFFICE
CERTIFICATE OF CORRECTION

PATENT NO. : 7,126,414 B2  Page 1 of 1
APPLICATION NO. : 10/934899
DATED : October 24, 2006
INVENTOR(S) : Huber et al.

It is certified that error appears in the above-identified patent and that said Letters Patent is hereby corrected as shown below:

On the title page, item (75) should read as follows:
(75)  Inventors: Herbert Huber, Vienna (AT); Tibor Olah, ~~Vienna (AT)~~ Budapest (HU)

Item (30) should be inserted after item (65)
(30)  Foreign Application Priority Data
April 4, 2003    (DE) 103 40 898.3

Signed and Sealed this

Eighth Day of January, 2008

JON W. DUDAS
*Director of the United States Patent and Trademark Office*

UNITED STATES PATENT AND TRADEMARK OFFICE
CERTIFICATE OF CORRECTION

PATENT NO. : 7,126,414 B2  
APPLICATION NO. : 10/934899  
DATED : October 24, 2006  
INVENTOR(S) : Huber et al.

Page 1 of 1

It is certified that error appears in the above-identified patent and that said Letters Patent is hereby corrected as shown below:

On the title page, item (75) should read as follows:
(75) Inventors: Herbert Huber, Vienna (AT); Tibor Olah, ~~Vienna (AT)~~ Budapest (HU)

Item (30) should be inserted after item (65)
--(30) Foreign Application Priority Data
September 4, 2003 (DE) 103 40 898.3--

This certificate supersedes the Certificate of Correction issued January 8, 2008.

Signed and Sealed this
Seventeenth Day of May, 2011

David J. Kappos
*Director of the United States Patent and Trademark Office*